(12) United States Patent
Lee et al.

(10) Patent No.: US 8,809,885 B2
(45) Date of Patent: Aug. 19, 2014

(54) LIGHT EMITTING DEVICE

(71) Applicant: LG Innotek Co., Ltd., Seoul (KR)

(72) Inventors: Kwang Chil Lee, Seoul (KR); Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/724,398

(22) Filed: Dec. 21, 2012

(65) Prior Publication Data

US 2013/0161675 A1    Jun. 27, 2013

(30) Foreign Application Priority Data

Dec. 26, 2011    (KR) .......................... 10-2011-0142676

(51) Int. Cl.
*H01L 33/00* (2010.01)

(52) U.S. Cl.
USPC ................... 257/98; 257/E33.068; 257/99

(58) Field of Classification Search
CPC .................................. H01L 33/46; H01L 33/60
USPC .............................................. 257/98, E33.068
See application file for complete search history.

(56) References Cited

U.S. PATENT DOCUMENTS

| 2008/0197369 A1* | 8/2008 | Batres et al. ..................... 257/98 |
| 2012/0161600 A1* | 6/2012 | Norris et al. ..................... 313/11 |

\* cited by examiner

*Primary Examiner* — Tu-Tu Ho
(74) *Attorney, Agent, or Firm* — Birch, Stewart, Kolasch & Birch, LLP

(57) ABSTRACT

Disclosed is a light emitting device. The light emitting device comprises a light emitting structure comprising a plurality of compound semiconductor layers; and a light extraction structure on the light emitting structure. The light extraction structure comprises a plurality of first layers and a plurality of second layers which are alternately disposed with each other to have a negative refraction index.

19 Claims, 19 Drawing Sheets

LIGHT EMITTING DEVICE

The present application claims priority under 35 U.S.C. §119(a) of Korean Patent Application No. 10-2011-0141952 filed on Dec. 26, 2011 and Korean Patent Application No. 10-2011-0142676 filed on Dec. 26, 2011, which are hereby incorporated by reference in its entirety.

BACKGROUND

The embodiment relates to a light emitting device.

A light emitting diode (LED) is a semiconductor light emitting device to convert current into light.

Since a semiconductor light emitting device may obtain a high-luminance light, the semiconductor light emitting device has been extensively used as a light source for a display, a vehicle, or a lighting device.

However, due to characteristics of a semiconductor light emitting device, it is difficult to extract light in the semiconductor light emitting device to an outside of the semiconductor light emitting device, so that the light extraction efficiency is lowered.

Further, the semiconductor light emitting device may not have the uniform light efficiency.

SUMMARY

The embodiment provides a light emitting device having improved light extraction efficiency.

The embodiment provides a light emitting device capable of obtaining uniform light efficiency.

According to the embodiment, there is provided a light emitting device comprising a light emitting structure comprising a plurality of compound semiconductor layers; and a light extraction structure on the light emitting structure. The light extraction structure comprises a plurality of first layers and a plurality of second layers which are alternately disposed with each other to have a negative refraction index.

According to the embodiment, there is provided a light emitting device comprising a substrate; a first conductive semiconductor layer on the substrate; an active layer on the first conductive semiconductor layer; a second conductive semiconductor layer on the active layer; and a light extraction structure on the second conductive semiconductor layer, wherein the first conductive semiconductor layer is an n-type semiconductor layer and the second conductive semiconductor layer is a p-type semiconductor layer. The light extraction structure comprises a plurality of first layers and a plurality of second layers which are alternately disposed with each other to have a negative refraction index. The first layer is a dielectric layer and the second layer is a metal layer. At least one of the first and second layers has a thickness of $0.2\lambda_p$, wherein $\lambda_p$ denotes a plasma frequency of the second layer.

According to the embodiment, there is provided a light emitting device comprising a first conductive semiconductor layer; an active layer under the first conductive semiconductor layer; a second conductive semiconductor layer below the active layer; an electrode layer under the second conductive semiconductor layer; and a light extraction structure on the first conductive semiconductor layer. The first conductive semiconductor layer is an n-type semiconductor layer and the second conductive semiconductor layer is a p-type semiconductor layer. The light extraction structure comprises a plurality of first layers and a plurality of second layers which are alternately disposed with each other to have a negative refraction index. The first layer is a dielectric layer and the second layer is a metal layer. At least one of the first and second layers has a thickness of $0.2\lambda_p$, wherein $\lambda_p$ denotes a plasma frequency of the second layer.

DETAILED DESCRIPTION OF THE EMBODIMENTS

Figure 1:
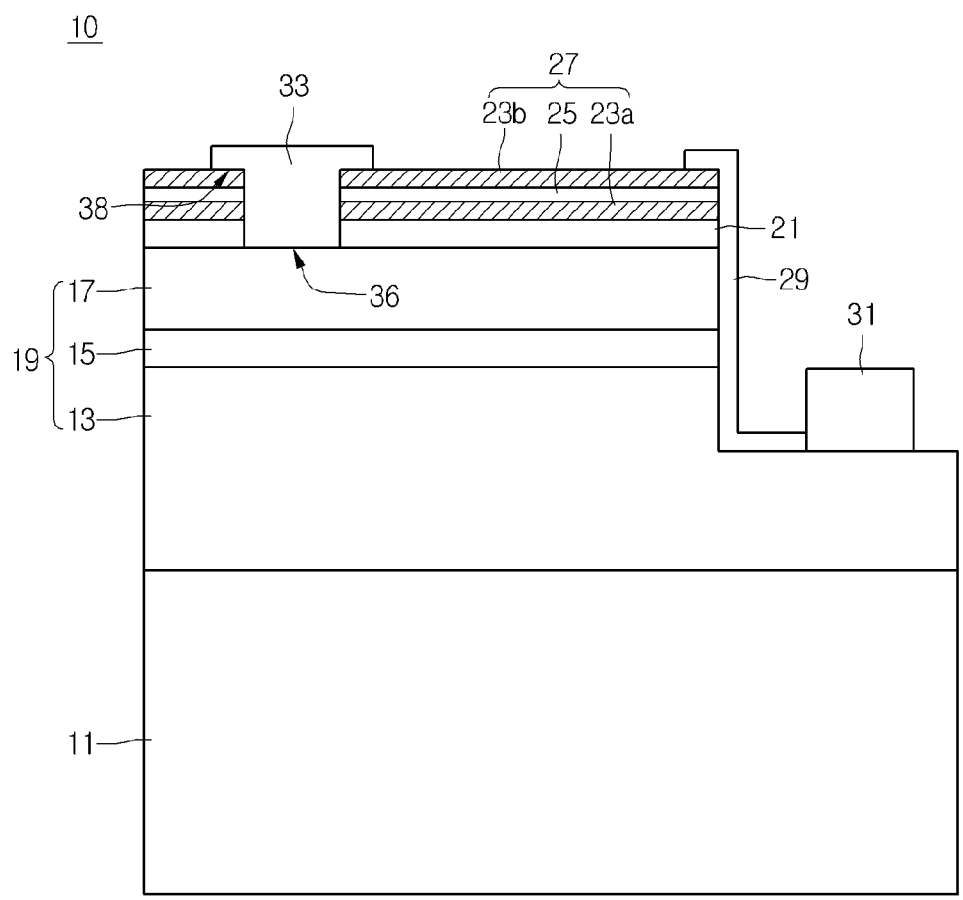
FIG. 1 is a sectional view showing a lateral-type light emitting device according to the first embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a lateral type light emitting device according to the first embodiment.

Referring to FIG. 1, the lateral type light emitting device 10 may include a substrate 11, a light emitting structure 19, a light extraction structure 27, a first electrode 31 and a second electrode 33.

The light emitting device 10 according to the first embodiment may further include a conductive layer 21 interposed between the light emitting structure 19 and the light extraction structure, but the embodiment is not limited thereto. The conductive layer 21 is formed of a transparent conductive material.

The light emitting structure 19 may include a plurality of compound semiconductor layer. The compound semiconductor layer may include a first conductive semiconductor layer 13, an active layer 15 and a second conductive semiconductor layer 17, but the embodiment is not limited thereto.

In order to reduce the lattice mismatch due to the lattice constant difference between the substrate 11 and the first conductive semiconductor layer 13, the light emitting device 10 may further include a buffer layer (not shown) disposed between the substrate 11 and the first conductive semiconductor layer 13, but the embodiment is not limited thereto.

The buffer layer prevents a defect, such as a crack, a void, a grain, and a bowing, from being created in the light emitting structure formed on the substrate 11.

Although not depicted in the drawings, a non-conductive semiconductor layer, which has no dopants, may be further interposed between the buffer layer and the first conductive layer 13, but the embodiment is not limited thereto.

The buffer layer, the first conductive semiconductor layer 13, the active layer 15 and the second conductive semiconductor layer 17 may be formed with a group II-VI or III-V compound semiconductor material, but the embodiment is not limited thereto.

A nitride-based material may be used as the compound semiconductor material, but the embodiment is not limited thereto.

For example, the compound semiconductor layer may include a compound of the nitride-based material and at least one of Al, In and Ga.

The substrate 11 may be formed with a superior thermal-conductive and/or transmittance material, but the embodiment is not limited thereto. For example, the substrate 11 may be formed with at least one selected from the group of $Al_2O_3$, SiC, Si, GaAs, GaN, ZnO, GaP, InP and Ge, but the embodiment is not limited thereto.

The first conductive semiconductor layer 13 may be formed on the substrate 11 or the buffer layer.

For example, the first conductive semiconductor layer 13 may be an n-type semiconductor layer including an n-type dopant, but the embodiment is not limited thereto. For instance, the first conductive semiconductor layer 13 may include AlGaN or GaN, but the embodiment is not limited. The n-type dopant may include Si, Ge or Sn, but the embodiment is not limited thereto.

The first conductive semiconductor layer 13 may serve as a conductive layer for providing a first carrier, for example, electrons to the active layer 15, and may serve as a barrier layer for preventing a second carrier, for example, holes from migrating to the buffer layer.

As a high-concentration dopant is doped into the first conductive semiconductor layer 13, the first conductive semiconductor layer 13 may serve as a conductive layer through which electrons move freely.

As the first conductive semiconductor layer 13 is formed of a compound semiconductor material having a bandgap equal to or greater than that of the active layer 15, the first conductive semiconductor layer 13 may perform the function of a barrier layer which prevents holes from migrating to the buffer layer.

The active layer 15 may be formed under the first conductive semiconductor layer 13.

For example, the active layer 15 may emit an ultraviolet light by recombination of electrons provided from the first conductive semiconductor layer 13 and holes provided from the second conductive semiconductor layer 17. In order to generate the ultraviolet light, the active layer 15 must have at least a wide bandgap.

The active layer 15 may include one of an SQW (single quantum well) structure, an MQW (multiple quantum well) structure, a quantum wire structure or a quantum dot structure.

The active layer 15 may be formed of one selected from the group consisting of GaN, InGaN, AlGaN and AlInGaN, or may be formed by periodically repeating them.

The active layer 15 according to the embodiment may generate the ultraviolet light having a wavelength in the range of 365 nm to 488 nm, but the embodiment is not limited thereto.

For example, the active layer 15 according to the embodiment may generate one of the ultraviolet lights having wavelengths of 365 nm, 405 nm and 488 nm.

The second conductive semiconductor layer 17 may be formed on the active layer 15. For example, the second conductive semiconductor layer 17 may be a p-type semiconductor layer including a p-type dopant, but the embodiment is not limited thereto. The second conductive semiconductor layer 17 may include AlGaN or GaN, but the embodiment is not limited thereto. The p-type dopant may include Mg, Zn, Ca, Sr or Ba, but the embodiment is not limited thereto.

The second conductive semiconductor layer 17 may serve as a conductive layer to supply holes to the active layer 17.

The second conductive semiconductor layer 17 is doped with dopants at the high concentration to serve as a conductive layer allowing holes to freely move.

For example, the second conductive semiconductor layer 17 may include AlGaN or GaN, but the embodiment is not limited thereto.

In order to prevent the electrons of the active layer 15 from migrating to the second conductive semiconductor layer 17, a third conductive semiconductor layer may be interposed between the active layer 15 and the second conductive semiconductor layer 17, but the embodiment is not limited thereto.

In more detail, an electron blocking layer may be interposed between the active layer 15 and the second conductive semiconductor layer 17 in order to more reliably prevent electrons of the active layer 15 from migrating to the second conductive semiconductor layer 17, but the embodiment is not limited thereto.

For example, the third conductive semiconductor layer and the electron blocking layer may include AlGaN, but the embodiment is not limited thereto.

For example, the electron blocking layer may have at least the bandgap greater than that of the second conductive semiconductor layer or the third conductive semiconductor layer, but the embodiment is not limited thereto.

For example, when the third conductive semiconductor layer and the electron blocking layer include AlGaN, the electron blocking layer may have the content of Al higher than that of the third conductive semiconductor layer so that the electron blocking layer may have the bandgap greater than that of the third conductive semiconductor layer, but the embodiment is not limited thereto.

A conductive layer 21 may be formed on the second conductive semiconductor layer 17. The conductive layer 21 may serve as a conductive layer for obtaining spreading effect of providing an electric power to an area larger than that of the second conductive semiconductor layer 17. The conductive layer 21 may be formed of a transparent material so that the light passes toward an outside therethrough.

The conductive layer 21 may is formed of a transparent conductive material including at least one selected from the group consisting of ITO, IZO (In—ZnO), GZO (Ga—ZnO), AZO (Al—ZnO), AGZO (Al—Zn ZnO), IGZO (Al—Zn ZnO), IrOx, RuOx, RuOx/ITO, Ni/IrOx/Au and Ni/IrOx/Au/ITO, but the embodiment is not limited thereto.

The light extraction structure 27 may be formed on the conductive layer 21.

The light extraction structure 27 allows the light to be output out of the light emitting device 10 without causing the light to remain in the light emitting device, so that the light extraction efficiency may be improved.

The light generated from the active layer 15 may be travelled in all directions. One portion of the light may be travelled to the substrate 11 via the first conductive semiconductor layer 13, and the other portion of the light may be travelled to the conductive layer 21 via the second conductive semiconductor layer 17.

The light emitting structure 19 may have a refractive index greater than that of an external air. For example, the light emitting structure 19 may have a refractive index in the range of 2 to 4. Thus, the light, which is travelled into the second conductive semiconductor layer 17 or the conductive layer 21, may be output to an outside and may be reflected into an inside of the light emitting structure 19. That is, the light, which is incident at the incidence angle ($\alpha 1$) equal to or greater than a predetermined angle with respect to the second conductive semiconductor layer 17 or the conductive layer 21, is not output to an outside, but total-reflected into the inside.

Figure 3A:
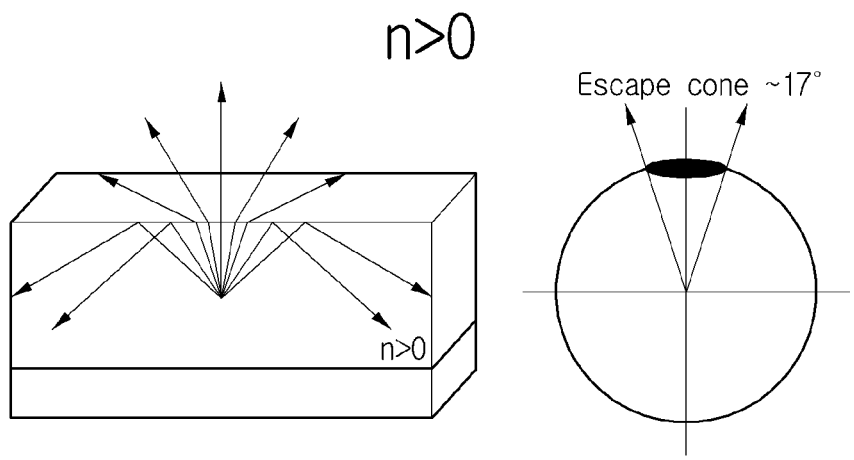
FIGS. 3a and 3b are views illustrating a propagation of a light according to a refractive index.

In other words, as shown in FIG. 3a, when a light is incident onto a medium having a refractive index greater than zero (0), the light which is incident at 17° or above may be total-reflected to an inside.

Figure 3B:
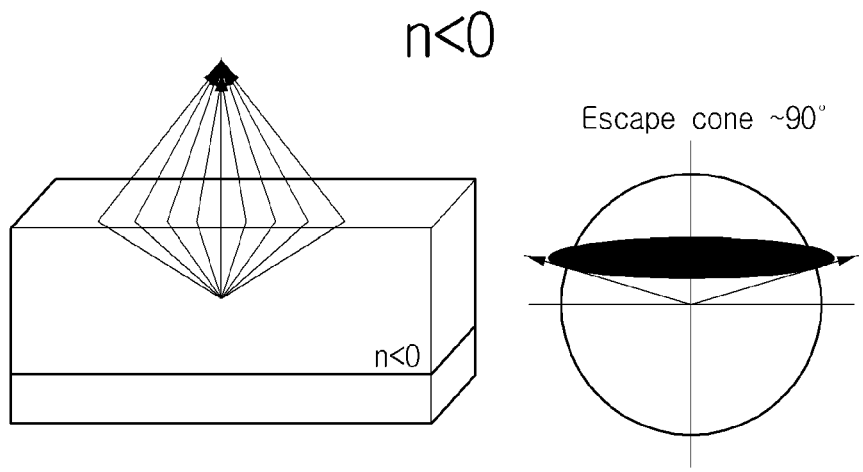

To the contrary, as shown in FIG. 3b, when a light is incident onto a medium having a refractive index less than zero (hereinafter, referred to as a negative refractive index), the light which is incident at 90° or above may be only total-reflected.

As shown in FIGS. 3a and 3b, when a medium having a negative refractive index is used, most of light may be output to an outside.

The light extraction structure may be designed to have a negative refraction index, so that the light extraction efficiency may be maximized.

Figure 2:
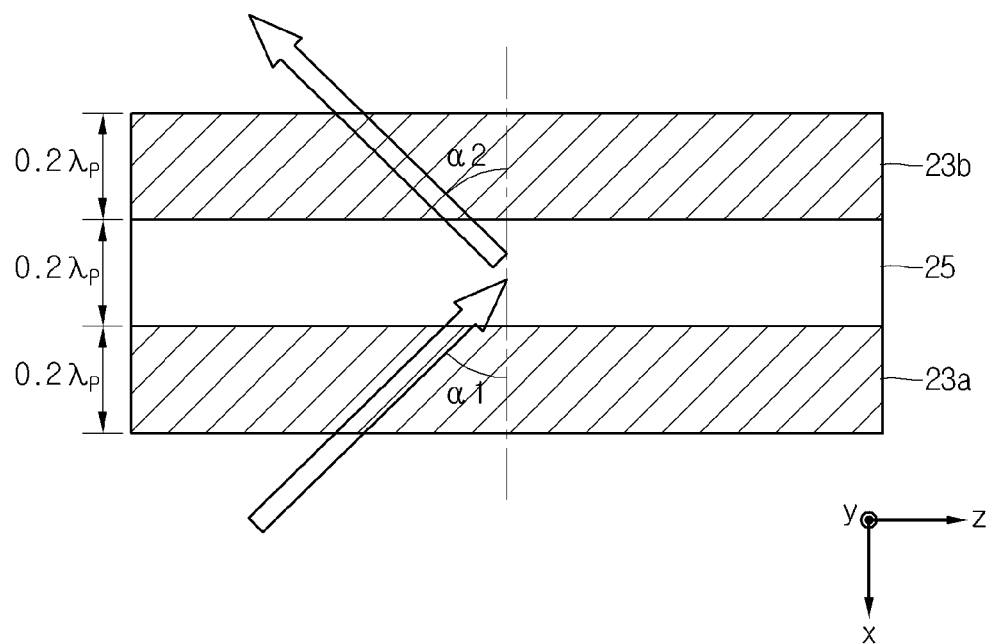
FIG. 2 is a view showing a light extraction structure depicted in FIG. 1.

As shown in FIG. 2, the light extraction structure 27 may include a multiple-layer in which the metal layers 23a and 23b and a dielectric layer 25 are disposed.

The metal layers 23a and 23b may be formed of a metal material. For example, metal layers 23a and 23b may include one selected from the group consisting of aluminum (Al), titanium (Ti), chrome (Cr), nickel (Ni), platinum (Pt), gold (Au), tungsten (W), copper (Cu), and molybdenum (Mo), but the embodiment is not limited thereto A transparent oxide-based material, a transparent nitride-based material or a transparent carbide-based material may be used as the dielectric layer 25.

The transparent oxide-based material may include at least one selected from the group consisting of ITO, IZO (In—ZnO), GZO (Ga—ZnO), AZO (Al—ZnO), AGZO (Al—Zn ZnO), IGZO (Al—Zn ZnO), IrOx, RuOx, $SiO_2$ and $SiO_x$, but the embodiment is not limited thereto.

The ITO, IZO (In—ZnO), GZO (Ga—ZnO), AZO (Al—ZnO), AGZO (Al—Zn ZnO), IGZO (Al—Zn ZnO), IrOx and RuOx among these oxide-based materials may serve as a conductive layer that performs a current spreading function.

For example, the transparent nitride-based material may be $Si_3N_4$ or $Si_xN_y$, but the embodiment is not limited thereto.

The $SiO_2$, $SiO_x$, $Si_3N_4$ or $Si_xN_y$ may serve as an insulation layer.

For example, the transparent carbide-based material may include SiC, but the embodiment is not limited thereto.

Although a three-layer structure including the first metal layer 23a, the dielectric layer 25 and the second metal layer 23b are only depicted in FIG. 2, the light extraction structure 27 according to the embodiment may include a multi-layer having three layers or more.

Figure 5:
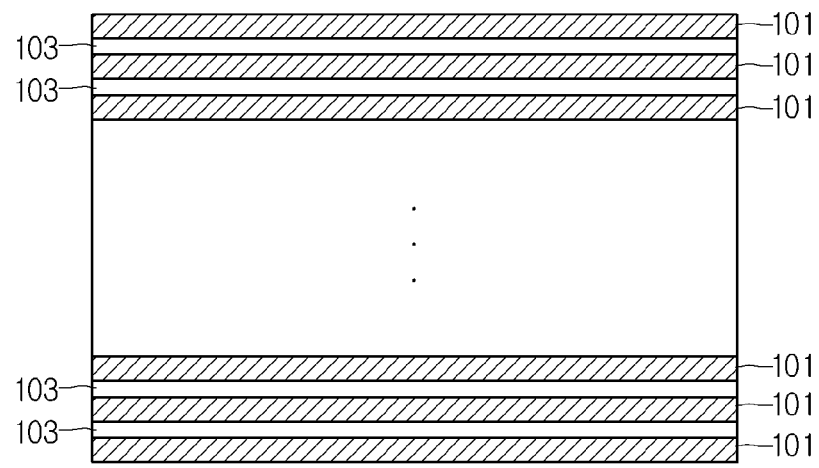
FIG. 5 is a view showing another light extraction structure depicted in FIG. 1.

That is, as shown in FIG. 5, the light extraction structure 27A of the embodiment may include a multi-layer structure in which a plurality of metal layers 101 and a plurality of dielectric layers 103 are arranged alternately with each other.

The lower-most layer and the upper-most layer of the multi-layer may be metal layers 101.

The metal layer 101 may determine the transmittance of light. That is, according to the design of the metal layer 101, the light may be transmitted therethrough or absorbed therein.

Hereinafter, the metal layers 23a and 23b and the dielectric layer 25 will be described for the purpose of convenience.

Figure 4A:
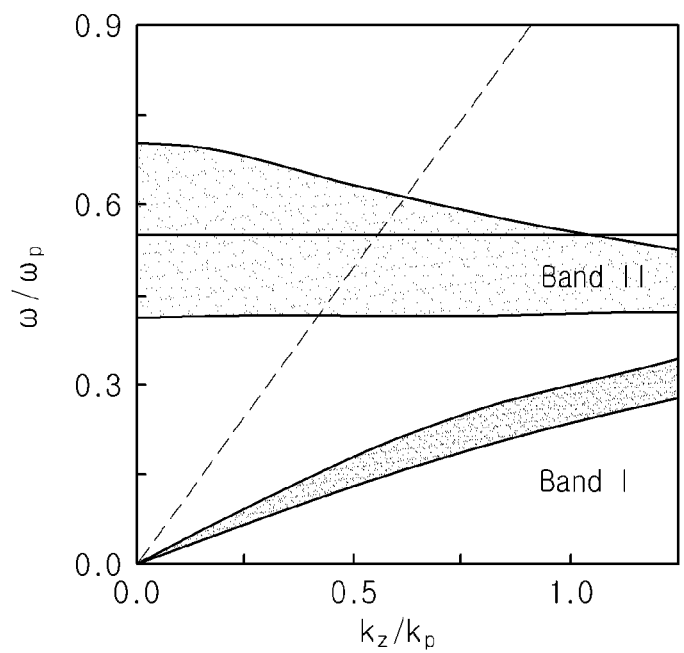
FIGS. 4a to 4c are views illustrating the mechanism of light propagation.
Figure 4B:
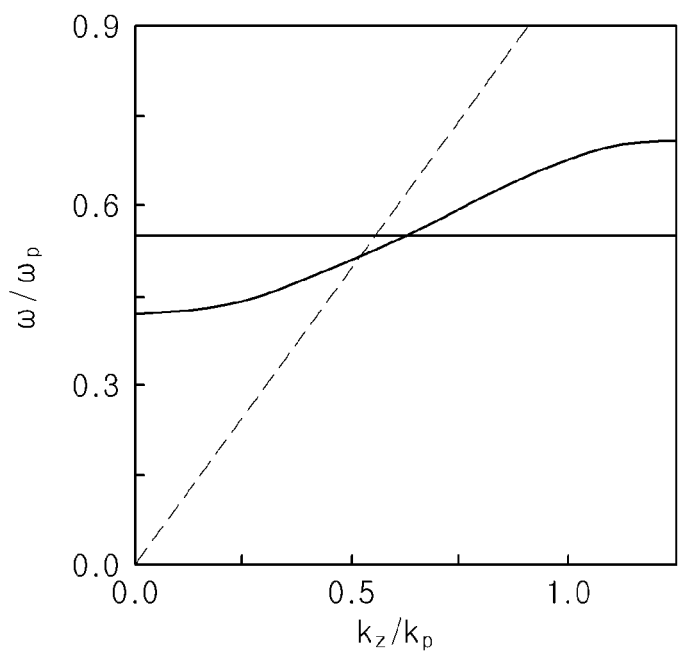
Figure 4C:
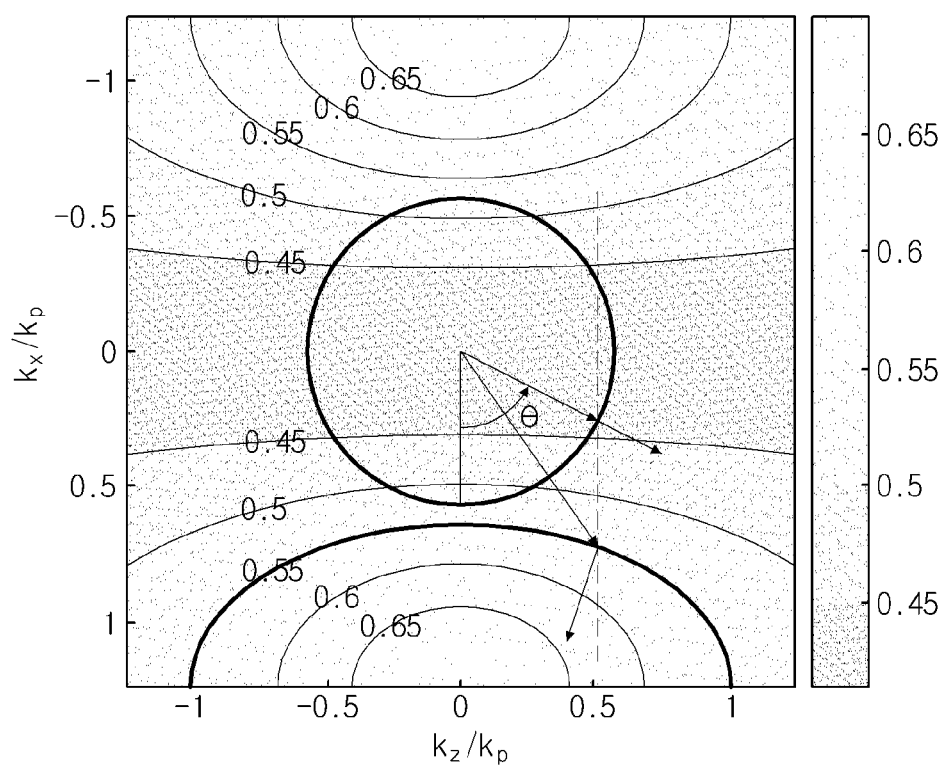

As shown in FIGS. 4a to 4c, the metal layers 23a and 23b have a typical plasma frequency ($\omega_p$) and a typical plasma momentum ($k_p$) according to the kind of the metal material.

Thus, the typical wavelength or frequency ($\omega$) of the light may be determined according to the kind of the material.

In addition, a z-axis momentum ($k_z$) may exist in a horizontal direction with the surface(s) of the metal layers 23a and 23b or the dielectric layer 25 in the light extraction structure 27, and an x-axis momentum ($k_x$) may exist in a perpendicular direction with the surface(s) of the metal layers 23a and 23b or the dielectric layer 25 in the light extraction structure 27.

In this case, as shown in FIGS. 4a and 4b, the metal layers 23a and 23b have the negative refractive index characteristic when the ratio of the light frequency (w) to the plasma frequency ($\omega_p$) is approximate to 0.6 according to the z-axis momentum ($k_z$) as shown in the region of Band II.

In FIG. 4c, the horizontal axis denotes the z-axis momentum ($k_z$) to the plasma momentum ($k_p$) and the vertical axis denotes the x-axis momentum ($k_x$) to the plasma momentum ($k_p$).

As shown in FIG. 4c, the metal layers 23a and 23b have the negative refractive index characteristic with respect to the z-axis momentum.

Although a light is incident on the light extraction structure 27 at almost 90°, due to the negative refractive index characteristic, the light may not be reflected toward the inside of the light extraction structure 27 and output toward to the outside of the light extraction structure 27.

In order to allow the light extraction structure 27 of the first embodiment to have the negative refractive index characteristic, the metal layers 23a and 23b and the dielectric layer 25 all may have the thickness of $0.2\lambda_p$, wherein $\lambda_p$ denotes the plasma frequency ($\omega_p$) of the metal layers 23a and 23b, but the embodiment is not limited thereto.

Since $\lambda_p$ is varied according to the material of the metal layers 23a and 23b, the thicknesses of the metal layers 23a and 23b and the dielectric layer 25 may be varied according to a metal material used for the metal layers 23a and 23b.

For example, when silver (Ag) is used as the metal material, the plasma wavelength ($\lambda_p$) of silver Ag may be about 137.61 nm. In this case, the thicknesses of the metal layers 23a and 23b and the dielectric layer 25 may be 0.2*137.61=27.522 nm.

The thicknesses of the metal layers 23a and 23b and the dielectric layer 25 may be equal to or different from each other.

For example, although the thicknesses of the metal layers 23a and 23b is $0.2\lambda_p$, the dielectric layer 25 may be designed to have the thickness greater or lower than $0.2\lambda_p$, but the embodiment is not limited thereto.

Thus, the materials and the thicknesses of the metal layers 23a and 23b and the dielectric layer 25 may be selected according to the wavelength of light of the active layer 15. Thus, it seems as if the light extraction structure 27 has the characteristics of a negative refractive index and in spite of an opaque metal layers 23a and 23b, light may be transmitted therethrough. Due to the light extraction structure 27 having the characteristics of a negative refractive index, the light is not total-reflected but output to an outside, so that the light extraction efficiency may be significantly improved.

For example, when silver (Ag) is used as the metal layers 23a and 23b and one of ITO and $Si_3N_4$ is used as the dielectric layer 25 for the lights having wavelengths of 365 nm and 405 nm, the lights may be easily extracted toward an outside through the light extraction structure 27 in which the metal layers 23a and 23b and the dielectric layer 25 are disposed.

For example, when silver (Ag) is used as the metal layers 23a and 23b and SiC is used as the dielectric layer 25, the light having the wavelength of 488 nm may be easily extracted toward an outside through the light extraction structure 27 in which the metal layers 23a and 23b and the dielectric layer 25 are disposed.

The light incident onto the light extraction structure 27 may be reflected toward an outside with respect to a vertical interfacial surface aligned in the vertical direction, that is, the direction perpendicular to the top surface of the light extraction structure 27.

For example, when the light is incident onto the left lower portion of the light extraction structure 27 in a diagonal direction, the light may be reflected toward the left upper portion of the light extraction structure 27 in the diagonal direction with respect to the vertical interfacial surface and output toward an outside. In this case, the incident angle ($\alpha1$) of the incident light and the reflection angle ($\alpha2$) of the reflected light to the vertical interfacial surface may be equal to or different from each other, but the embodiment is not limited thereto.

The first electrode 31 may be formed on the first conductive semiconductor layer 13 and the second electrode 33 may be formed on the light emitting structure 19 that is, the second conductive semiconductor layer 17.

When the dielectric layer 25 of the light extraction structure 27 is a conductive material such as ITO, the second electrode 33 may be formed on the light extraction structure 27.

To the contrary, when the dielectric layer 25 of the light extraction structure 27 is a non-conductive material such as SiC, the second electrode 33 may be formed to allow the back surface of the second electrode 33 to make contact with the second conductive semiconductor layer 17. In this case, for example, the second electrode 33 may make contact with the conductive layer 21 through the light extraction structure 27 or the second conductive semiconductor layer 17 through the light extraction structure 27 and the conductive layer 21.

Since the top surface of the second electrode 33 must perform a function of a pad for supply an electric power, the top surface of the second electrode 33 may have a size larger than that of the through hole of the light extraction structure 27 or the conductive layer 21.

The second electrode 33 may have first and second back surface 36 and 38. The first back surface 36 may make contact with the second conductive semiconductor layer 17 through the light extraction structure 27 and the conductive layer 21. The second back surface 38 may make contact with the light extraction structure 27, that is, a portion of the top surface of the metal layer 23b which is the uppermost layer of the light extraction structure 27.

As described above, the second electrode 33 may be formed to pass through the light extraction structure 27 or the conductive layer 21, so that the adhesive strength of the second electrode 33 may be improved.

Meanwhile, in order to prevent the side surface of the light emitting structure 19 from being electrically short, that is, between the first conductive semiconductor layer 13 and the second conductive semiconductor layer 17, a protection layer 29 may be formed on at least one side surface of the light emitting structure 19.

The protection layer 29 may be formed on the side surface of the light emitting structure 19 and an edge area of the top surface of the light extraction structure 27 in which the second electrode 33 is formed.

The protection layer 29 may be formed of a low-conductive material or an insulation material having a superior transparency. The protection layer 29 may be formed of at least one selected from the group consisting of $Si_xO_y$, $Si_3N_4$, $Si_xN_y$, $Al_2O_3$ and $TiO_2$, but the embodiment is not limited thereto.

In the first embodiment, the light extraction structure 27, in which the metal layers 23a and 23b and the dielectric layer 25 are disposed, is formed to reflect the light to the outside, not to the inside, so that the light extraction efficiency may be maximized.

Although not depicted in the drawings related to the first embodiment described above, a light extraction structure may be further formed on the first conductive semiconductor layer 13 on which the first electrode 31 is formed, such that, when the light from the active layer 15 is travelled to the substrate 11, reflected at the substrate 11 and travelled to the first conductive semiconductor 13, the light may be more much output to an outside. That is, except for the first electrode 31, the light extraction structure may be formed on the entire surface of the first conductive semiconductor layer 13. Further, the first electrode 31 may pass through the light extraction structure to make contact with the top surface of the first conductive semiconductor layer 13.

Figure 6:
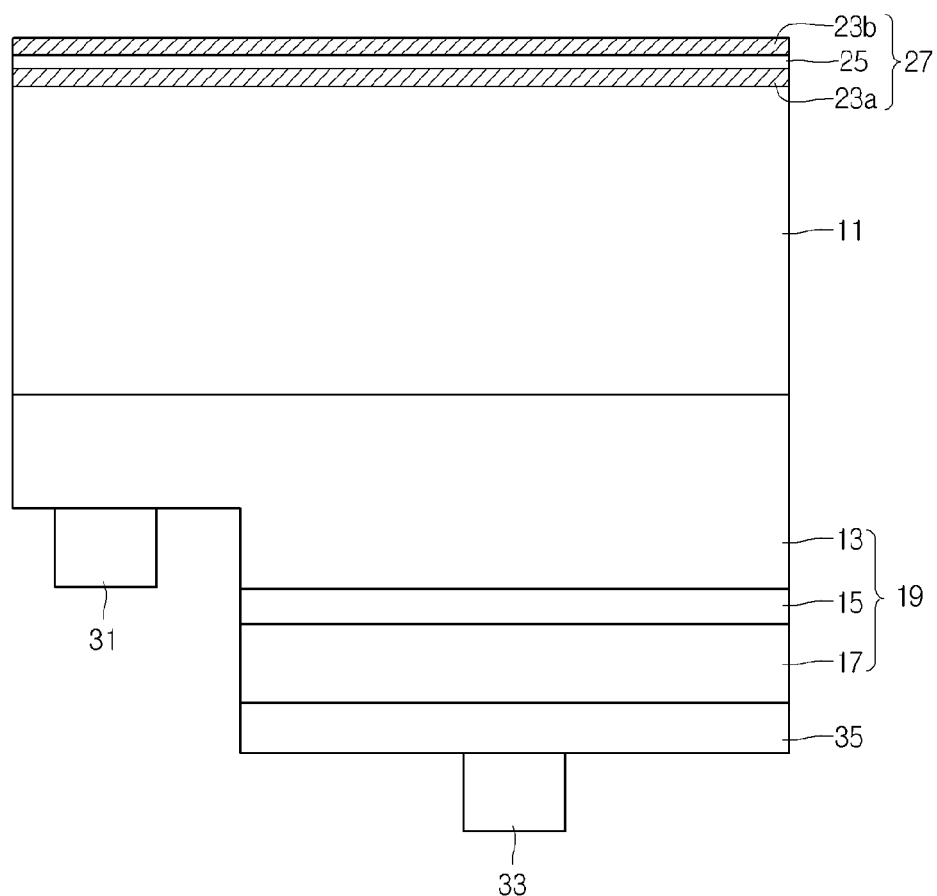
FIG. 6 is a sectional view showing a flip-type light emitting device according to the second embodiment.

FIG. 6 is a view showing a flip-type light emitting device according to the second embodiment.

The second embodiment is substantially the same as the first embodiment except that a reflection layer 35 is used instead of the conductive layer 21, a light extraction structure 27 is formed on the substrate 11 and the light emitting device is turned over to be used.

In the second embodiment, the same reference numerals will be assigned to the components the same as those of the first embodiment, and the details thereof will be omitted.

Referring to FIG. 6, the flip-type light emitting device 10A according to the second embodiment may include a substrate 11, a light emitting structure 19, a reflection layer 35, a light extraction layer 27 and first and second electrodes 31 and 33.

Similar to the first embodiment, although not depicted in FIG. 6, a protection layer may be formed to prevent a side surface of the light emitting structure 19 from being electrically shorted.

The light emitting device 10 according to the first embodiment may have a structure of allowing a light to be output to an outside through the second conductive semiconductor layer 17 and the conductive layer 21.

To the contrary, the light emitting device according to the second embodiment may have a structure of allowing a light to be output to an outside through the substrate 11.

Thus, the light extraction structure 27 may be formed on the substrate 11 to output more much light travelling to the substrate 11 to an outside.

Since the configuration and operational function of the light extraction structure 27 have been described in detail in the first embodiment, the detail description about the light extraction structure 27 will be omitted.

Since the light extraction structure 27 is formed on the substrate 11, the light travelling to the light extraction structure 27 through the substrate 11 may not be total-reflected to an inside, but reflected to the outside with respect to a vertical interfacial surface aligned in the direction perpendicular to the top surface of the light extraction structure 27.

For example, the reflection layer 35 may be formed of a metal layer having superior conductivity and reflectivity. The reflection layer 35 may include one selected from the group consisting of Ag, Ni, Al, Rh, Pd, Ir, Ru, Mg, Zn, Pt, Au, and Hf, or the alloy thereof, but the embodiment is not limited thereto.

When the reflection layer 35 does not have a superior conductivity, it is difficult to provide an electric power supplied to the second electrode 33 to the second conductive semiconductor layer 17 due to the reflection layer 35.

According to the second embodiment, the light extraction structure 27, in which the metal layers 23a and 23b and the dielectric layer 25 are disposed, is formed to reflect the light to the outside, not to the inside, so that the light extraction efficiency may be maximized.

Figure 7:
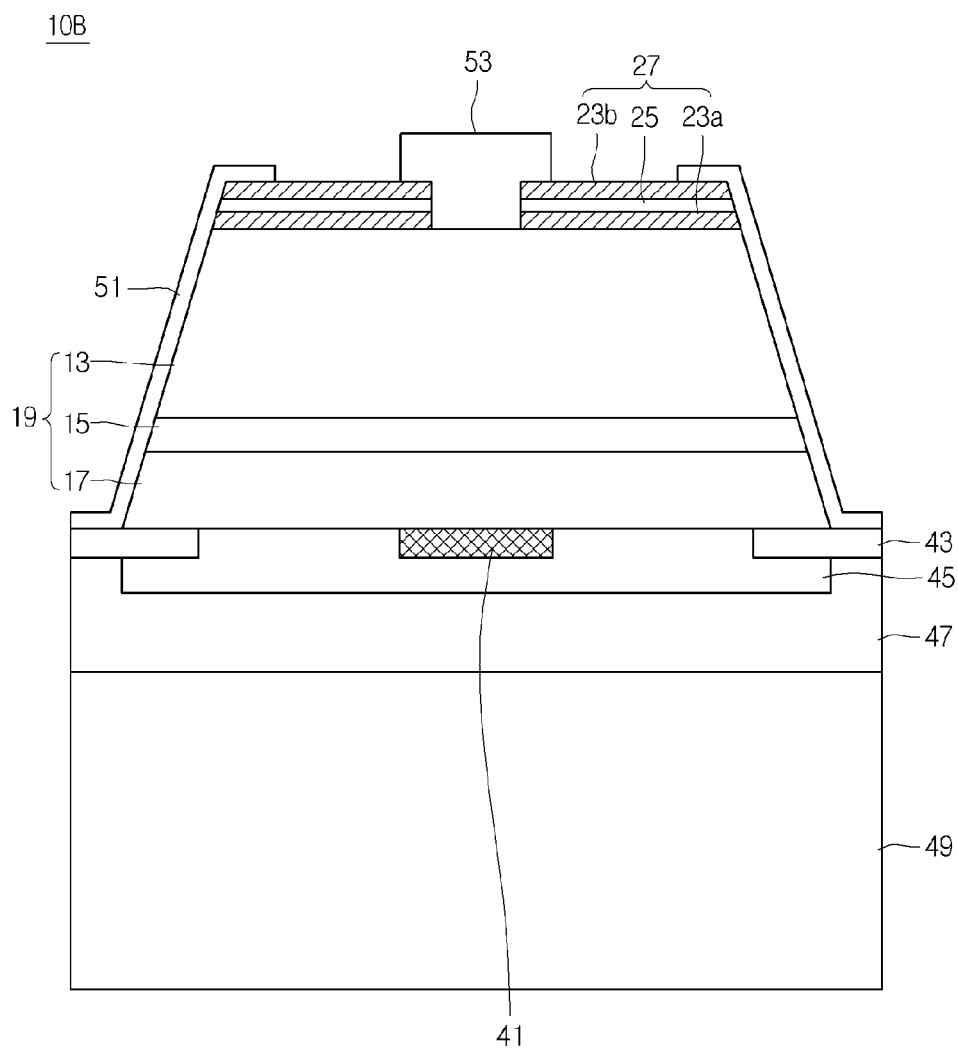
FIG. 7 is a sectional view showing a vertical-type light emitting device according to the third embodiment.

FIG. 7 is a sectional view showing a vertical-type light emitting device according to the third embodiment.

Referring to FIG. 7, a channel layer 43, an electrode layer 45, an adhesive layer 47 and a conductive support layer 49 may be formed on the second conductive semiconductor layer 17 in a lateral-type light emitting device 10 according to the first embodiment and then, the substrate 11 may be removed after reversing it at 180 degrees. The side surface of the light emitting structure 19 may be formed to be inclined through a mesa etching and the light extraction structure 27 for improving light extraction efficiency may be formed on the top surface of the first conductive semiconductor layer 13. Then, a protection layer 51 may be formed on a side surface of the light emitting structure and parts of the top surfaces of the channel layer 43 and the light emitting structure 19, and an electrode layer 53 may be formed on the light emitting structure 27. In this way, the vertical-type light emitting device 10B according to the third embodiment may be fabricated.

Since the structure and function of the light emitting structure 27 are the same as those of the first embodiment, the detail description will be omitted.

The electrode layer 45 may have a reflection characteristic of reflecting light and in addition, may be formed of a material having conductivity for supplying an electric power to the light emitting structure 19. For example, the electrode layer 45 may be formed of at least one selected from the group consisting of Ag, Ni, Al, Rh, Pd, Ir, Ru, Mg, Zn, Pt, Au and Hf, or the alloy thereof, the embodiment is not limited thereto.

The conductive support member 49 may be formed of a material having conductivity through which an electric current flows. For example, the conductive support member 49 may be formed of at least one selected from the group consisting of Cu, Au, Ni, Mo and Cu—W, the embodiment is not limited thereto.

The protection layer 51 may be formed of a material equal to or different from that of the channel layer 43, the embodiment is not limited thereto.

The channel layer 43 and/or the protection layer 51 may be formed by using one of an oxide material, a nitride material and an insulation material. The channel layer 43 and/or the protection layer 51 may be formed of at least one selected from the group consisting of, ITO, IZO, IZTO, IAZO, IGZO, IGTO, AZO, ATO, GZO, $SiO_2$, $SiO_x$, $SiO_xN_y$, $Si_3N_4$, $Al_2O_3$, and $TiO_2$.

Similar to the second electrode 33 of the first embodiment, the electrode 53 may extend through the light extraction structure 27. That is, the electrode 53 includes first and second back surfaces, and the first back surface may make contact with the first conductive semiconductor layer 13 through the light extraction structure 27. The second back surface may make contact with the light extraction structure 27, that is, a portion of the top surface of the metal layer 23b which is the uppermost layer of the light extraction structure 27.

As described above, the first back surface of the electrode 53 makes contact with an inner surface of the light extraction structure 27 and the outer surface of the first conductive semiconductor layer 13, and the second back surface of the electrode makes contact with a portion of the top surface of the metal layer 23b, so that the adhesive performance of the electrode 53 may be improved.

Meanwhile, a current blocking layer 41 for preventing current from being concentrated in a vertical direction may be formed to be superimposed upon the electrode 53 in a vertical direction.

The current blocking layer 41 may be formed of a material which is the same as or different from that of at least one of the protection layer 51 and the channel layer 43, but the embodiment is not limited thereto.

Figure 8:
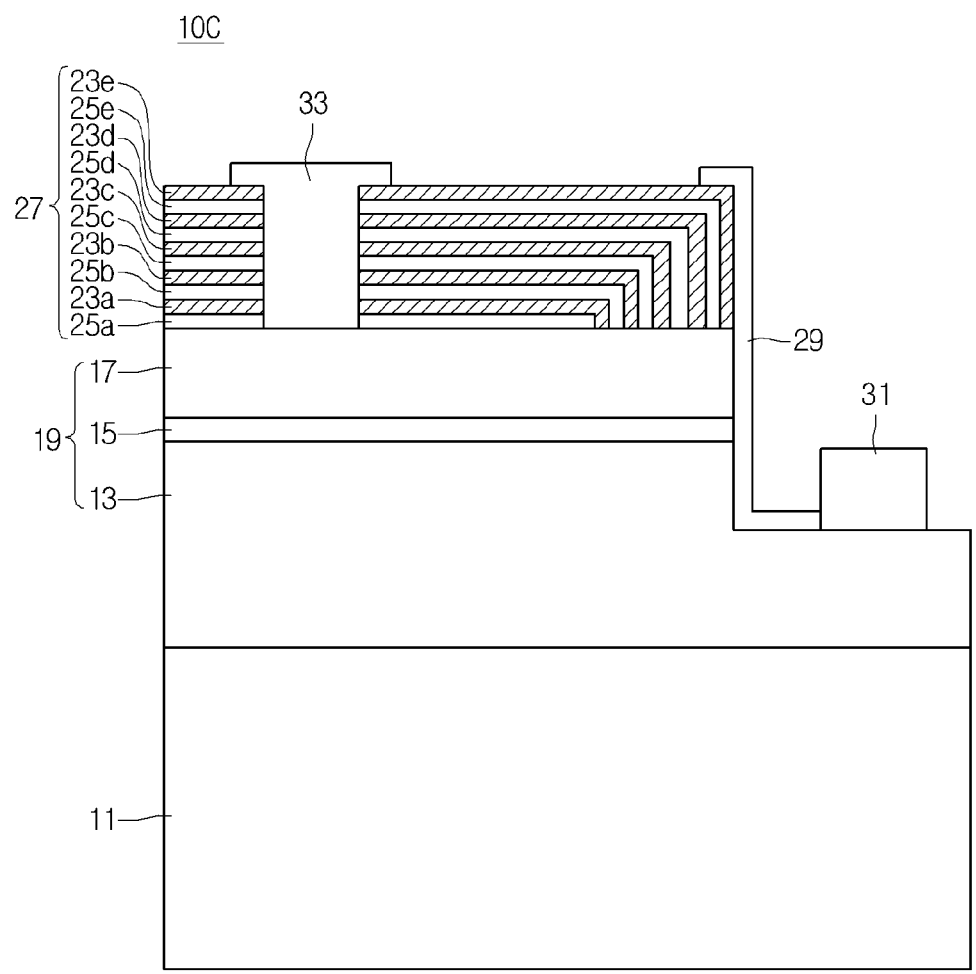
FIG. 8 is a sectional view showing a lateral-type light emitting device according to the fourth embodiment.

FIG. 8 is a sectional view showing a lateral-type light emitting device according to the fourth embodiment.

The fourth embodiment is very similar to the first embodiment except that one-side ends of the metal layers 23a to 23e and the dielectric layers 25a to 25e make contact with the top surface of the second conductive semiconductor layer 17. In the fourth embodiment, the same reference numerals will be assigned to the components having the same function or structure as those of the first embodiment, and the details thereof will be omitted.

Referring to FIG. 8, the lateral-type light emitting device 10C may include a substrate 11, a light emitting structure 19, a light extraction structure 27, a first electrode 31 and a second electrode 33.

Figure 9:
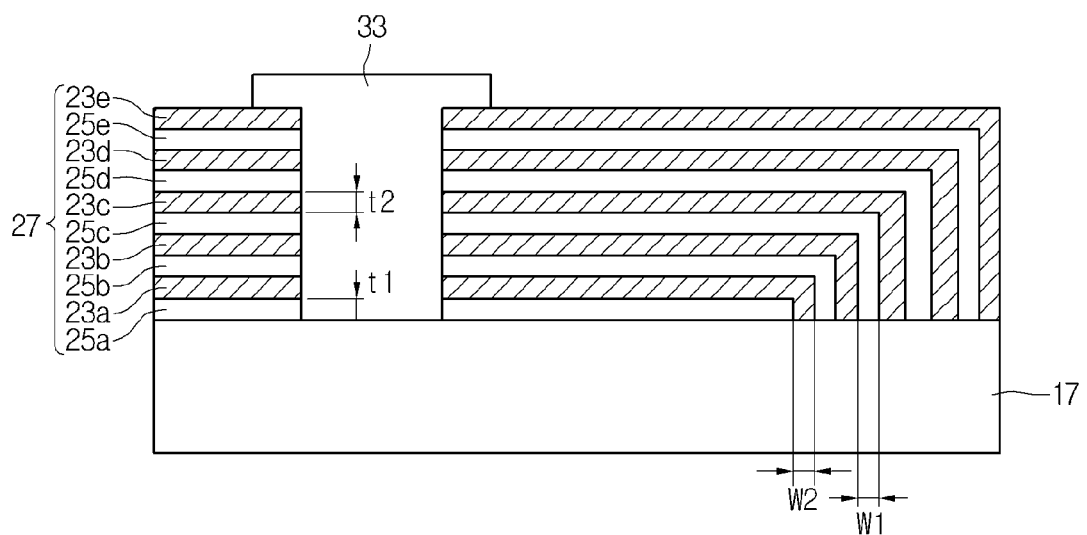
FIG. 9 is a view showing a light extraction structure depicted in FIG. 8.

As shown in FIG. 9, the light extraction structure 27 may include a multiple-layer in which metal layers 23a to 23e and dielectric layer 25a to 25e are alternately disposed.

A transparent oxide-based material, a transparent nitride-based material or a transparent carbide-based material may be used as the dielectric layers 25a to 25e.

When the dielectric layers 25a to 25e are formed of the oxide-based material, the dielectric layers 25a to 25e may be form ohmic contacts with the second conductive semiconductor layer 17.

The lowermost layer of the multi-layer may be a dielectric layer 25a and the uppermost layer of the multi-layer may be a metal layer 23e.

In the light extraction structure 27 of the fourth embodiment, an upper layer may be formed to cover the lower layer placed below the upper layer. To this end, the upper layers have areas larger than those of the lower layers.

For example, the first dielectric layer 25a which is the uppermost layer is formed on a portion of the top surface of the second conductive semiconductor layer 17, the first metal layer 23a is formed to cover the top surface and a side surface of the first dielectric layer 25a, the second dielectric layer 25b is formed to cover the top surface and a side surface of the first metal layer 23a, the second metal layer 23b is formed to cover the top surface and a side surface of the first dielectric layer 25b, the third dielectric layer 25c is formed to cover the top surface and a side surface of the second metal layer 23b, the third metal layer 23c is formed to cover the top surface and a side surface of the second dielectric layer 25b, the fourth dielectric layer 25d is formed to cover the top surface and a side surface of the third metal layer 23c, the fourth metal layer 23d is formed to cover the top surface and a side surface of the fourth dielectric layer 25d, the fifth dielectric layer 25e is formed to cover the top surface and a side surface of the fourth metal layer 23d, and the fifth metal layer 23e is formed to cover the top surface and a side surface of the fifth dielectric layer 25e.

The first dielectric layer 25a which is the lowermost layer of the light extraction structure 27 may be a dielectric layer 25 having transparency and conductivity. In this case, the first dielectric layer 25a may be formed of a material for forming an ohmic contact with the second conductive semiconductor layer 17. Thus, the current provided to the second electrode 33 may be spread as much as an area of the first dielectric layer 25a and in addition, may be injected into the second conductive semiconductor layer 17.

According to the fourth embodiment, as the upper layers are formed to cover one-side surfaces of the lower layers, the one-side ends of the upper layers formed to cover the side surfaces of the lower layers may make contact with the top surface of the second conductive semiconductor layer 17.

For example, the first metal layer 23a may be formed to cover the top surface and one side surface of the first layer and in addition, one side end of the first metal layer 23a extending from a side surface of the first dielectric layer 25a may make contact with the top surface of the second conductive semiconductor layer 17.

For example, the second dielectric layer 25b may be formed to cover the top surface and one side surface of the first metal layer 23a and in addition, one side end of the second dielectric layer 25b extending from a side surface of the first metal layer 23a may make contact with the top surface of the second conductive semiconductor layer 17.

For example, the second metal layer 23b may be formed to cover the top surface and one side surface of the second dielectric layer 25b and in addition, one side end of the second metal layer 23b extending from a side surface of the second dielectric layer 25b may make contact with the top surface of the second conductive semiconductor layer 17.

For example, the third dielectric layer 25c may be formed to cover the top surface and one side surface of the second metal layer 23b and in addition, one side end of the third dielectric layer 25c extending from a side surface of the second metal layer 23b may make contact with the top surface of the second conductive semiconductor layer 17.

In this way, the third to fifth metal layers 23c to 23e and the fourth and fifth dielectric layers 25d and 25e may be formed.

For example, the fifth metal layer 23e covers the top surface and one side surface of the fifth dielectric layer 25e and in addition, one side end of the fifth metal layer 23e extending from a side surface of the fifth dielectric layer 25e may make contact with the top surface of the second conductive semiconductor layer 17.

Each thickness of the dielectric layers 25a to 25e disposed in the vertical direction may be denoted as 't1', and each thickness of the metal layers 23a to 23e disposed in the vertical direction may be denoted as 't2', each thickness or widths of the dielectric layers 25a to 25e disposed in the horizontal direction may be denoted as 'W1', and each thickness or widths of the metal layers 23a to 23e disposed in the horizontal direction may be denoted as 'W2', but the embodiment is not limited thereto.

In other words, 'W1' may denote the widths of the dielectric layers 25a to 25e which make contact with the second conductive semiconductor layer 17, and 'W2' may denote the widths of the metal layers 23a to 23e which make contact with the second conductive semiconductor layer 17, the embodiment is not limited thereto.

For the purpose of convenience and avoiding confusion, 't1' and 't2' denote thickness and 'W1' and 'W2' denote widths.

In the light extraction structure 27 according to the fourth embodiment, the thicknesses t1 and width W1 of the dielectric layers 25a to 25e, and the thicknesses t2 and width W2 of the metal layers 23a to 23e may have the same value, but the embodiment is not limited thereto.

Each of thicknesses may have $0.2\lambda_p$, but the embodiment is not limited thereto.

In the light extraction structure 27 according to the fourth embodiment, as well as the lowermost dielectric layer 25a, the plurality of layers including the dielectric layers 25b to 25e and the metal layer 23a to 23e may make contact with the second conductive semiconductor layer 17. In this case, the plurality of dielectric layers 25a to 25e may form ohmic contacts with the second conductive semiconductor layer 17, respectively.

Thus, the current provided to the second electrode 33 may be provided to the plurality of dielectric layers 25a to 25e which make contact with the second electrode 33, are formed alternately with plurality of metal layers 23a to 23e, and make contact with the top surface of the second conductive semiconductor layer 17. The current provided to the plurality of dielectric layers 25a to 25e may be injected more quickly and easily into the second conductive semiconductor layer 17 making contact with each dielectric layer 25a to 25e and may be equally provided to the entire area of the second conductive semiconductor layer 17, so that the current spreading efficiency may be maximized and the light efficiency may be remarkably improved.

Figure 10:
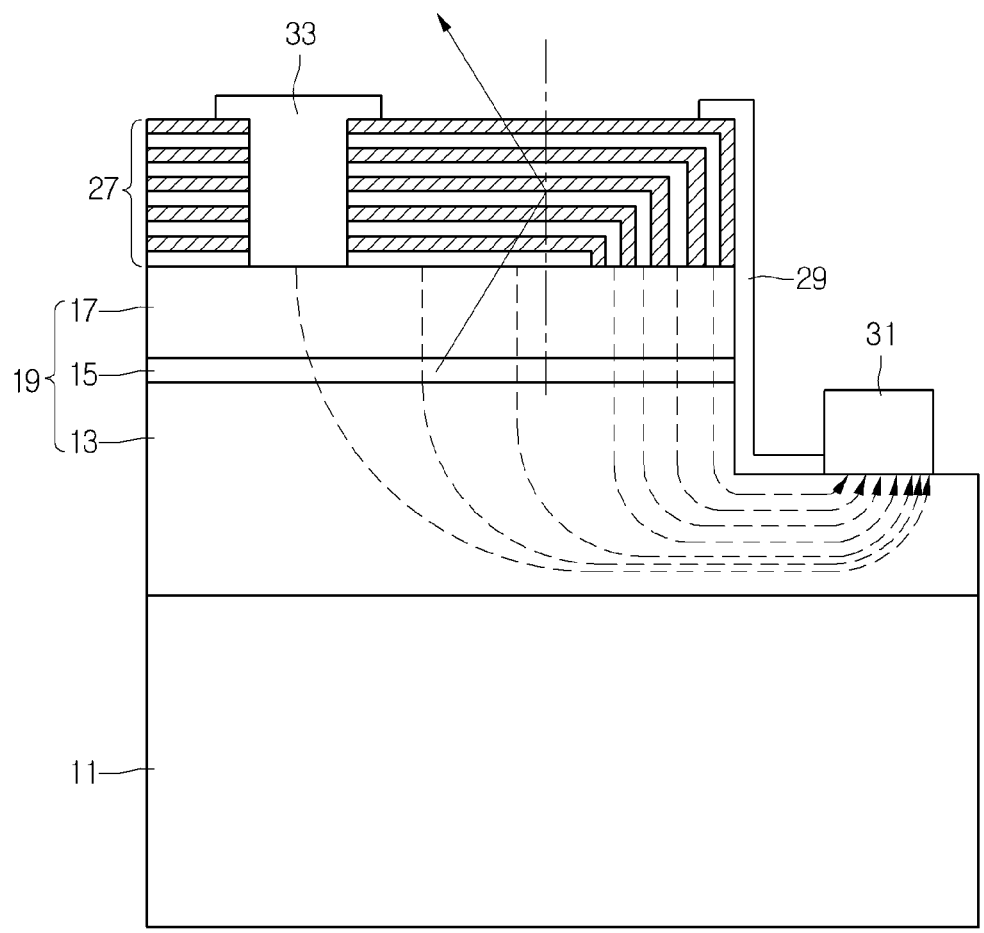
FIG. 10 is a view showing a propagation of a light and a current spreading.

As shown in FIG. 10, the light extraction structure 27 of the fourth embodiment may be formed as a multi-layer in which the dielectric layers 25a to 25e and the metal layers 23a to 23e are disposed, and each layer of which makes contact with the second conductive semiconductor layer 17, so that the light extraction efficiency may be maximized and the uniform light efficiency may be obtained.

The dielectric layers 25a to 25e included in the light extraction structure 27 may form ohmic contacts with the second conductive semiconductor layer 17. Thus, the current may be easily injected into the second conductive semiconductor layer 17 through the dielectric layers 25a to 25e which make contact with the second conductive semiconductor layer 17 and are disposed alternately with the metal layers 23. In other words, due to the dielectric layers 25a to 25e disposed alternately with the metal layers 23a to 23e to make contact with the second conductive semiconductor layer 17, the current injection efficiency may be increased, the current spreading effect may occur and the light efficiency may be improved.

In addition, the light extraction structure 27 may have a negative refractive index and permeability by specifying the thicknesses of each of the dielectric layers 25a to 25e and the metal layers 23a to 23e which are alternately disposed with each other and included in the light extraction structure, so that the light is reflected toward an outside instead of being total-reflected into an inside, so the light extraction efficiency may be maximized.

According to the fourth embodiment, the light extraction structure 27, in which the metal layers 23a and 23b and the dielectric layers 25a to 25e are disposed, is formed to reflect the light to the outside, not to the inside, so that the light extraction efficiency may be maximized.

Although not depicted in any drawings for the fourth embodiment, when the light of the active layer 15 is travelled onto the substrate 11 and reflected on the substrate 11 such that the light travels to the first conductive semiconductor layer 13, a light extraction structure may be further formed on the first conductive semiconductor layer 13 on which the first electrode 31 is formed in order to output more much light to an outside. Since this light extraction structure has been described above, the detail description will be omitted.

Figure 11:
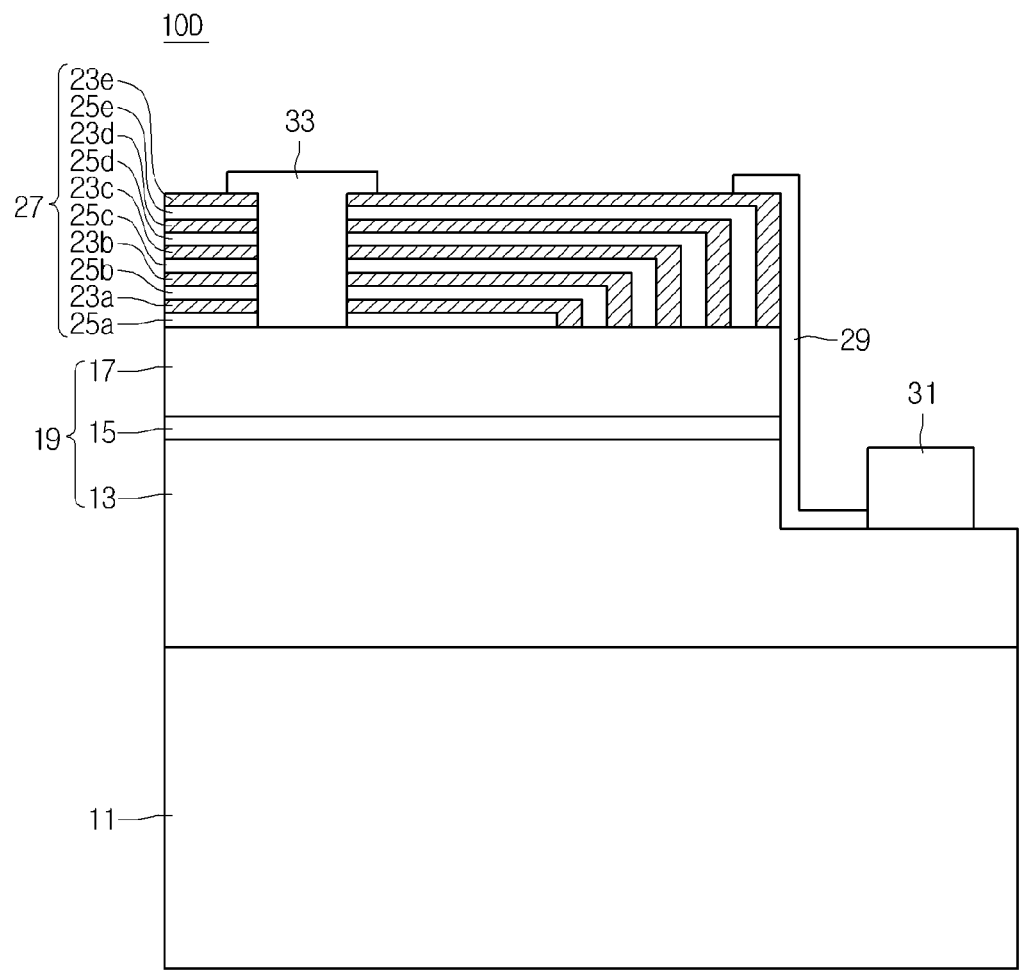
FIG. 11 is a sectional view showing a lateral-type light emitting device according to the fifth embodiment.
Figure 12:
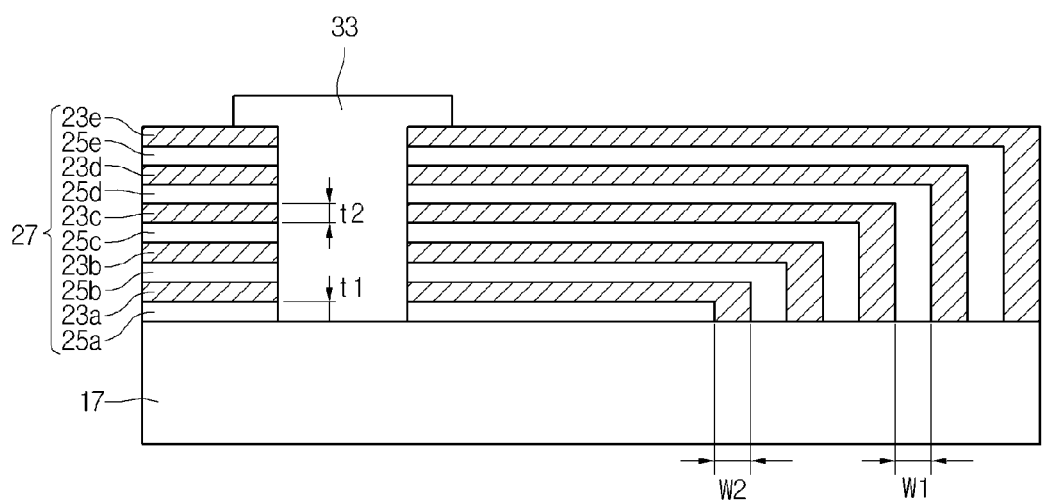
FIG. 12 is a view showing a light extraction structure depicted in FIG. 11.

FIG. 11 is a sectional view showing a lateral-type light emitting device according to the fifth embodiment, and FIG. 12 is a view showing the light extraction structure depicted in FIG. 11.

The fifth embodiment is almost similar to the fourth embodiment except that the thicknesses and widths of the metal layers 23a to 23e are different from those of the dielectric layers 25a to 25e in the light extraction structure 27.

In the fifth embodiment, the same reference numerals will be assigned to the components the same as those of the fourth embodiment, and the details thereof will be omitted.

As shown in FIG. 11, the lateral-type light emitting device 10D may include a substrate 11, a light emitting structure 19, a light extraction structure 27 and first and second electrodes 31 and 33.

The light emitting structure 19 may include a first conductive semiconductor layer 13, an active layer 15 and a second conductive semiconductor layer 17.

The light extraction structure 27 may include a plurality of dielectric layers 25a to 25e and a plurality of metal layers 23a to 23e.

The uppermost layer of the light extraction structure 27 may be the metal layer 23e and the lowermost layer of the light extraction structure 27 may be the dielectric layer 25a.

In the light extraction structure 27, an upper layer may be formed to cover the top surface and side surfaces of the lower layer placed below the upper layer, and one side end extending from one side surface of the lower layer may make contact with the top surface of the second conductive semiconductor layer 17.

In this way, the plurality of dielectric layers 25a to 25e and the plurality of metal layers 23a to 23e included in the light extraction structure 27 may be formed, so that the entire top surface of the second conductive semiconductor layer 17 may make contact with the plurality of dielectric layers 25a to 25e and the plurality of metal layers 23a to 23e.

According to the embodiment, in order to obtain current spreading effect, the dielectric layers 25a to 25e may be formed of a material for forming an ohmic contact with the second conductive semiconductor layer 17.

To this end, the dielectric layers 25a to 25e may be formed of an oxide-based material, the embodiment is not limited thereto. The metal layers 23a to 23e may be formed a material for forming a Schottky contact with the second conductive semiconductor layer 17.

In addition the dielectric layer 25a to 25e may be formed of a transparent insulation material, but the embodiment is not limited thereto.

When the dielectric layers 25a to 25e are formed of the material for the ohmic contacts with the second conductive semiconductor layer 17, the current is easily injected into the second conductive semiconductor layer 17 through the dielectric layers 25a to 25e which make contact with the top surface of the second conductive semiconductor layer 17 and in addition, current spreading effect occurs, so that the light efficiency may be improved and a uniform light may be obtained.

Further, due to the light extraction structure 27 including the plurality of dielectric layers 25a to 25e and the plurality of metal layers 23a to 23e, the light having an incidence angle approximate to 90° may be reflected toward an outside, so that the light extraction efficiency may be maximized.

Meanwhile, the widths of the dielectric layers 25a to 25e and the metal layers 23a to 23e may be different from thicknesses of the dielectric layers 25a to 25e and the metal layers 23a to 23e. The widths of the dielectric layers 25a to 25e may be equal to or different from each other. The widths of the metal layers 23a to 23e may be equal to or different from each other. The thicknesses of the dielectric layers 25a to 25e may be equal to or different from each other. The thicknesses of the metal layers 23a to 23e may be equal to or different from each other.

For example, the widths of the dielectric layers 25a to 25e may be set to be larger than the thicknesses of the dielectric layers 25a to 25e or the metal layers 23a to 23e.

For example, the widths of the metal layers 23a to 23e may be set to be larger than the thicknesses of the dielectric layers 25a to 25e or the metal layers 23a to 23e.

The thicknesses of the dielectric layers 25a to 25e may be equal to those of the metal layers 23a to 23e, but the embodiment is not limited thereto.

The widths of the dielectric layers 25a to 25e may be equal to those of the metal layers 23a to 23e, but the embodiment is not limited thereto.

Figure 13:
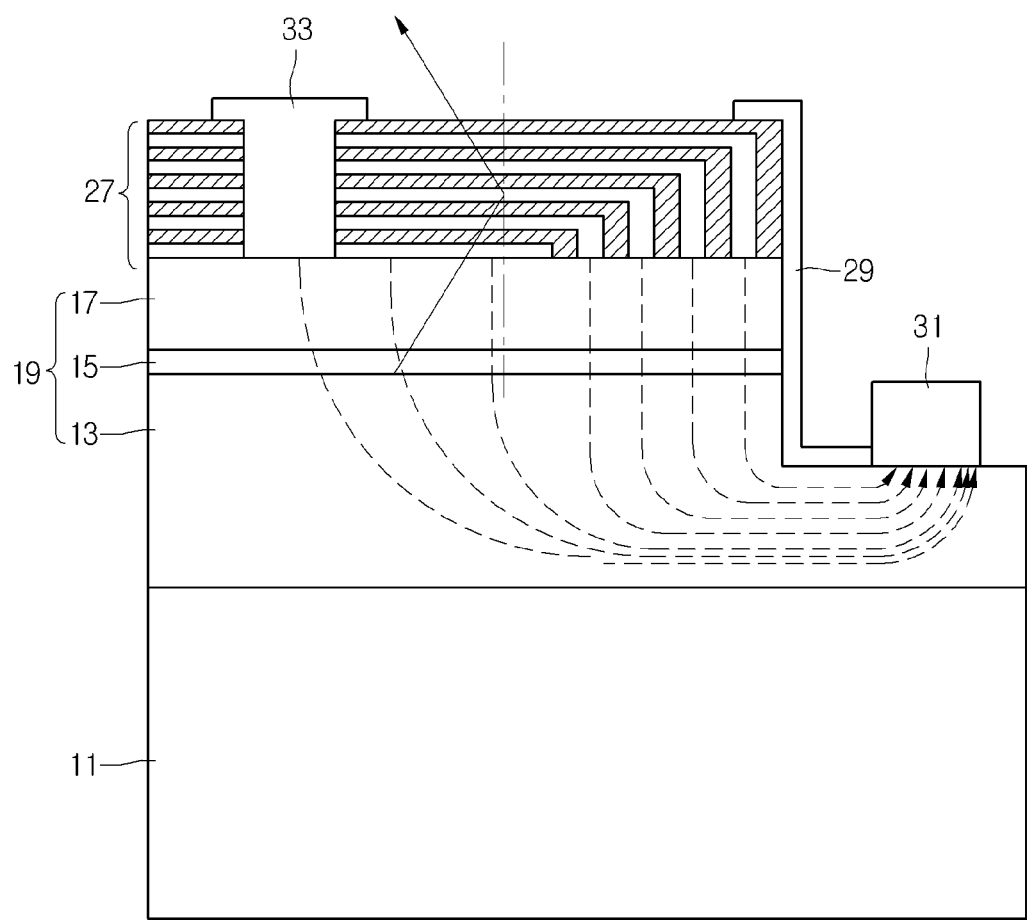
FIG. 13 is a view showing a propagation of a light and a current spreading.

According to the light emitting device having the above structure, as shown in FIG. 13, as the widths of the plurality dielectric layers 25a to 25e become larger gradually, the areas in which the second conductive semiconductor layer 17 makes contact with the dielectric layers 25a to 25e become larger in size and the dielectric layers 25a to 25e form the ohmic contact with the second conductive semiconductor layer 17, so that the current injection into the second conductor semiconductor layer 17 may be facilitated and the current spreading effect may be increased, so more uniform light efficiency may be obtained.

Figure 14:
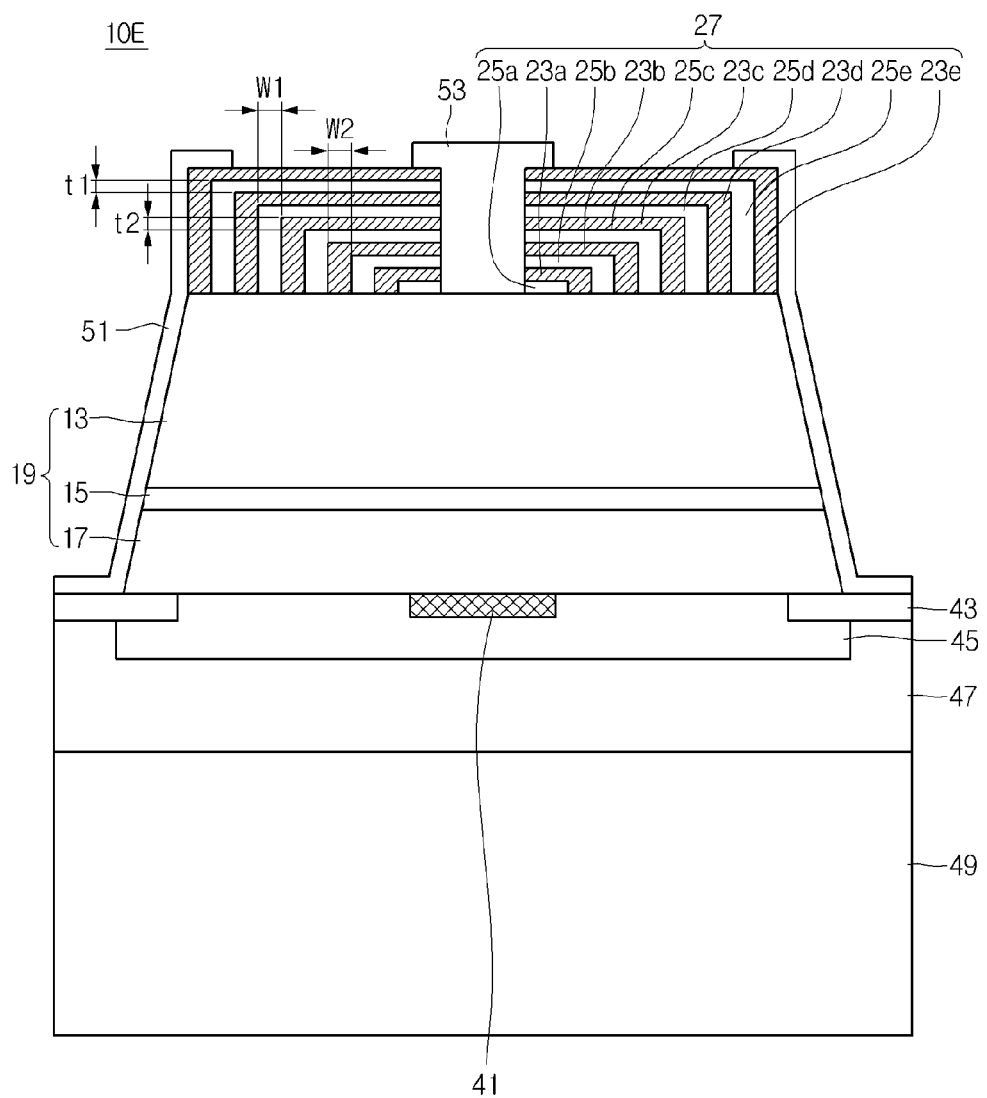
FIG. 14 is a sectional view showing a vertical-type light emitting device according to the sixth embodiment.

FIG. 14 is a view showing a vertical-type light emitting device according to the sixth embodiment.

The sixth embodiment is similar with the third or fourth embodiment except that the thicknesses and widths of the dielectric layers 25a to 25e are different from those of the metal layers 23a to 23 in the light extraction structure 27.

In the sixth embodiment, the same reference numerals will be assigned to the components the same as those of the third or fourth embodiment, and the details thereof will be omitted.

Referring to FIG. 14, the vertical-type light emitting device 10E according to the sixth embodiment may include a conductive support member 49, an adhesive layer 47, a channel layer 43, a light emitting structure 19, a light extraction structure 27, a protection layer 51 and an electrode 53.

The light extraction structure 27 may include a plurality of dielectric layers 25a to 25e and a plurality of metal layers 23a to 23e.

The thicknesses (t1 and t2) and widths (W1 and W2) of the insulation layers 25a to 25e and the metal layers 23a to 23e may be equal to or different from each other.

In the light extraction structure 27 of the sixth embodiment, the thicknesses (t1 and t2) and widths (W1 and W2) of the insulation layers 25a to 25e and the metal layers 23a to 23e may be equal to each other as in the fourth embodiment.

In the light extraction structure 27 of the sixth embodiment, the thicknesses (t1 and t2) and widths (W1 and W2) of the insulation layers 25a to 25e and the metal layers 23a to 23e may be equal to each other as in the fourth embodiment.

According to the sixth embodiment, since the light extraction structure 27 including the plurality of dielectric layers 25a to 25e and the plurality of metal layers 23a to 23e is formed on the first conductive semiconductor layer 13, the light extraction efficiency may be maximized.

According to the light extraction structure 27 of the sixth embodiment, since the plurality of dielectric layers 25a to 25e make ohmic contact with the first conductive semiconductor layer 13, the current provided to the electrode 53 is more easily injected into the first conductive semiconductor layer 13 through the plurality of dielectric layers 25a to 25e making contact with the first conductive semiconductor layer 13, so that the current spreading effect may be increased, so the light efficiency may be improved and a uniform light may be obtained.

According to the embodiment, the light extraction structure, in which the metal layer and the dielectric layer are disposed, is formed to reflect the light to the outside, not to the inside, so that the light extraction efficiency may be maximized.

According to the embodiment, since the multi-layer including the dielectric layers and the metal layers formed on the lowermost layer as well as the lowermost dielectric layer make contact with the light emitting structure, an electric power may be provided to the entire area of the top surface of the light emitting structure, so that the current spreading effect may be maximized and the uniform light efficiency may be obtained.

According to the embodiment, the power supply to the light emitting structure through the plurality of metal layers may be markedly facilitated, so that the light efficiency may be markedly improved.

A light emitting device according to the embodiment may be applied to a light unit. The light unit may include a structure in which a plurality of light emitting devices is arrayed. The light unit may include a display device depicted in FIGS. 15 and 16 and a lighting device depicted in FIG. 17 can be applied to a lighting lamp, a signal lamp, a headlight of a vehicle, a sign board, and an indicator lamp.

Figure 15:
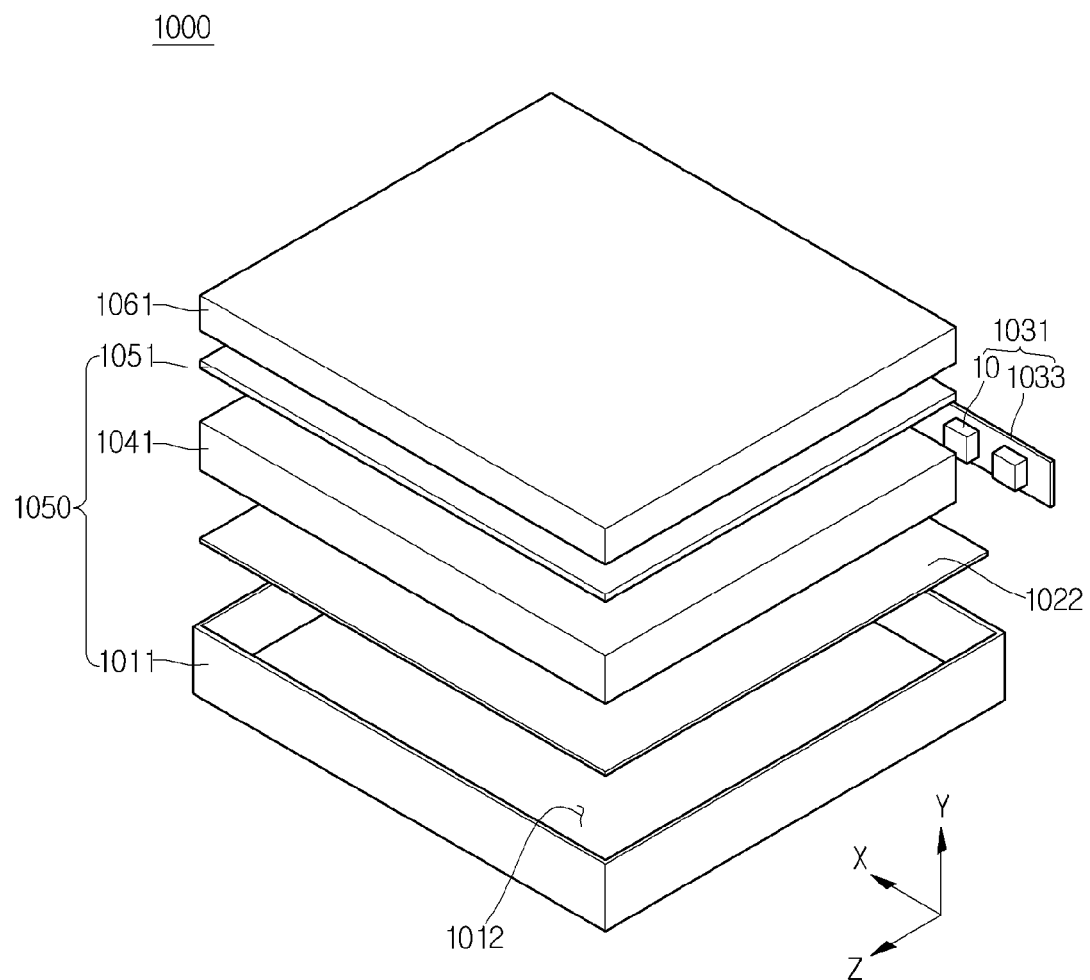
FIG. 15 is an exploded perspective view showing a display device according to the embodiment.

FIG. 15 is an exploded perspective view showing a display device according to the embodiment.

Referring to FIG. 15, the display device 1000 may include a light guide plate 1041, a light emitting module 1031 for providing light to the light guide plate 1041, a reflective member 1022 below the light guide plate 1041, an optical sheet 1051 on the light guide plate 1041, a display panel 1061 on the optical sheet 1051, and a bottom cover 1011 for receiving the light guide plate 1041, the light emitting module 1031 and the reflective member 1022, but the embodiment is not limited thereto.

The bottom cover 1011, the reflective member 1022, the light guide plate 1041, and the optical sheet 1051 may constitute the light unit 1050.

The light guide plate 1041 diffuses the light to provide surface light. The light guide 1041 includes transparent material. For instance, the light guide plate 1041 may be manufactured by using acryl-based resin, such as PMMA (polymethyl methacrylate), PET (polyethylene terephthalate), PC (polycarbonate), COC or PEN (polyethylene naphthalate) resin.

The light emitting module 1031 is disposed on at least one side surface of the light guide plate 1041 to supply the light to at least one side surface of the light guide plate 1041, and serves as the light source of the display device including the backlight unit.

At least one light emitting module 1031 is provided in the bottom cover 1011 to directly or indirectly supply the light from one side of the light guide plate 1041. The light emitting module 1031 may include a substrate 1033 and light emitting devices 10, which are disclosed above, and the light emitting devices 10 are arranged on the substrate 1033 while being spaced apart from each other at the predetermined interval. The substrate 1033 includes a circuit pattern having an electrode pad on at least one of top and bottom surfaces thereof. The substrate 1033 may also include a metal core PCB (MCPCB) or a flexible PCB (FPCB) as well as a PCB including resin, but the embodiment is not limited thereto. If the light emitting devices 100 are mounted on the lateral side or the heat radiation plate of the bottom cover 1011, the substrate 1033 may be removed. A portion of the heat radiation plate may make contact with the top surface of the bottom cover 1011. Therefore, the heat emitted from the light emitting device 10 may be emitted to the bottom cover 1011 through the heat radiation plate.

The plurality of light emitting devices 10 are arranged such that light exit surfaces to which the light emitted are spaced apart from the light guide plate 1041 by a predetermined distance, but the embodiment is not limited thereto. The light emitting devices 10 may provide directly or indirectly light to one side surface of the light guide plate 1041, but the embodiment is not limited thereto.

The reflective member 1022 may be disposed below the light guide plate 1041. The reflective member 1022 reflects the light, which is incident to the bottom surface of the light guide plate 1041, to be provided to the display panel 1061, thereby improving the brightness of the display panel 1061. For instance, the reflective member 1220 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1230 has a box shape with an open top surface, but the embodiment is not limited thereto. The bottom cover 1011 may be combined with a top cover (not shown), but the embodiment is not limited thereto.

The bottom cover 1011 may be manufactured through a press process or an extrusion process by using a metal material or a resin material. Further, the bottom cover 1011 may include metal having or non-metal having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough or blocking the light. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light source module 1031 as optical members, but the embodiment is not limited thereto.

Figure 16:
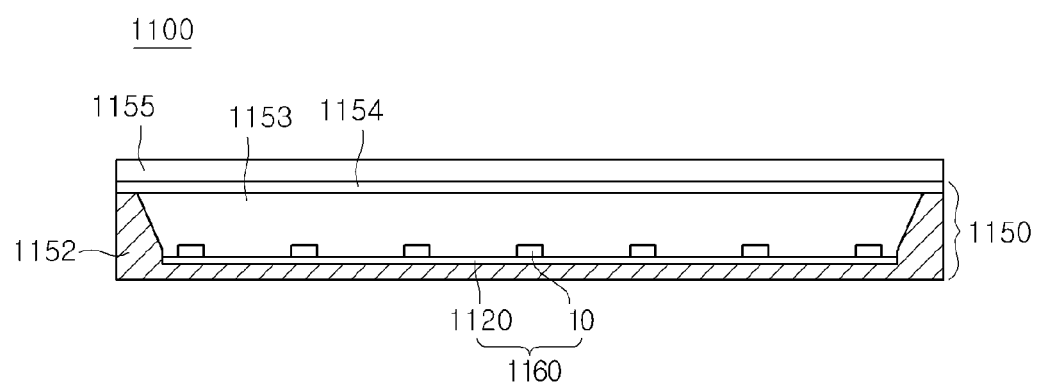
FIG. 16 is a view showing a display device according to the embodiment.

FIG. 16 is a view showing a display device according to the embodiment.

Referring to FIG. 16, the display device 1100 includes a bottom cover 1152, a substrate 1120 on which above-disclosed light emitting devices 10 are arrayed, an optical member 1154, and a display panel 1155.

The substrate 1120 and the light emitting devices 10 may constitute a light emitting module 1160. In addition, the bottom cover 1152, at least one light emitting module 1160, and the optical member 1154 may constitute a light unit (not shown).

The bottom cover 1152 can be provided therein with a receiving part 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display panel 1150, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

Figure 17:
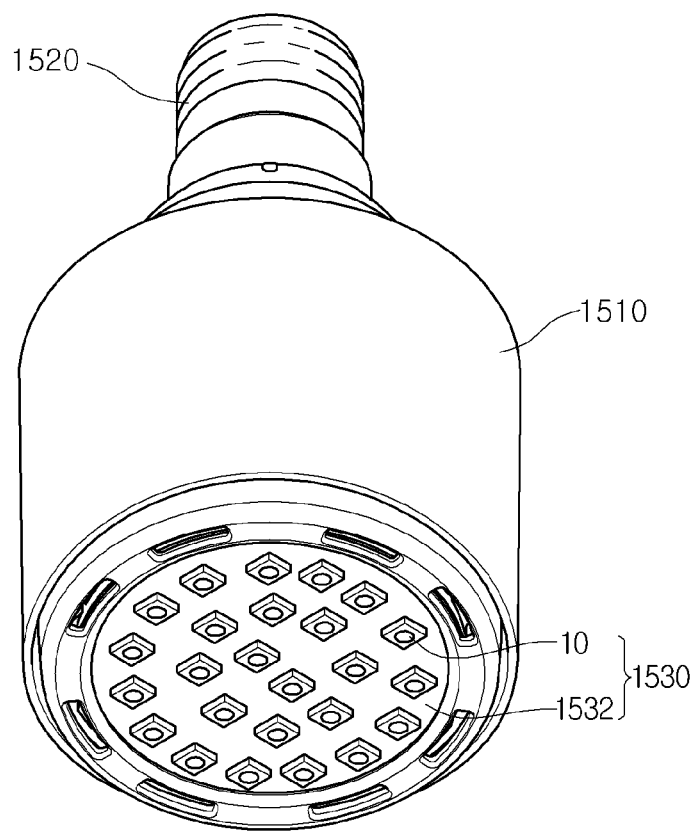
FIG. 17 is a view showing a lighting apparatus according to the embodiment.

FIG. 17 is a perspective view showing a lighting device according to the embodiment.

Referring to FIG. 17, a lighting device 1500 includes a case 1510, a light emitting module 1530 installed in the case 1510, and a connector 1520 installed in the case 1510 to receive power from an external power source.

Preferably, the case 1510 includes a material having superior heat radiation property. For example, the case 1510 includes a metal material or a resin material.

The light emitting module 1530 may include a substrate 1532 and light emitting device 10 according to the embodiment installed on the substrate 1532. The light emitting devices 10 are spaced apart from each other or arranged in the form of a matrix.

The substrate 1532 includes an insulating member printed with a circuit pattern. For example, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light source module 100 is installed on the substrate 1532. The light source module 100 may include at least one LED (light emitting diode) chip. The LED chip may include an LED that emits the light of visible ray band having red, green, blue or white color and a UV (ultraviolet) LED that emits UV light.

The light emitting modules 1530 may include the various combinations of the light emitting devices 10 to provide various colors and brightness. For example, the white LED, the red LED and the green LED can be combined to achieve the high color rendering index (CRI).

The connector 1520 is electrically connected to the light emitting module 1530 to supply power to the light emitting module 1530. The connection terminal 1520 has a shape of a socket screw-coupled with the external power source, but the embodiment is not limited thereto. For example, the connector 1520 can be prepared in the form of a pin inserted into the external power source or connected to the external power source through a wire.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure comprising a plurality of compound semiconductor layers;
a light extraction structure on the light emitting structure; and
an electrode on the light extraction structure,
wherein the compound semiconductor layers comprise:
an active layer;
a first conductive semiconductor layer under the active layer; and
a second conductive semiconductor layer on the active layer,
wherein the light extraction structure comprises a plurality of first layers and a plurality of second layers which are alternately disposed with each other to have a negative refraction index, and
wherein the electrode passes through the light extraction structure and contacts the light emitting structure.

2. The light emitting device of claim 1, wherein the light extraction structure is disposed on one of the first and second conductive semiconductor layers.

3. The light emitting device of claim 1, wherein the first layer is a dielectric layer and the second layer is a metal layer.

4. The light emitting device of claim 3, wherein the dielectric layer is formed of one of a transparent oxide-based material, a transparent nitride-based material and a transparent carbide-based material.

5. The light emitting device of claim 1, wherein the first layer is a lowermost layer of the light extraction structure and the second layer is an uppermost layer of the light extraction structure.

6. The light emitting device of claim 1, wherein the first and second layers each has a thickness of $0.2\lambda_p$, wherein $\lambda_p$ denotes a plasma frequency of the second layer.

7. The light emitting device of claim 1, wherein an upper layer of the first and second layers covers a side surface and a top surface of a lower layer and a portion extending from the upper layer makes contact with a top surface of one of the first and second layers.

8. The light emitting device of claim 7, wherein thicknesses of the first and second layers are equal to each other in a vertical direction.

9. The light emitting device of claim 8, wherein widths of the first and second layers are equal to each other in a horizontal direction.

10. The light emitting device of claim 9, wherein the widths of the first and second layers are greater than the thicknesses of the first and second layers.

11. The light emitting device of claim 7, wherein thicknesses of the first and second layers are different from each other in a vertical direction.

12. The light emitting device of claim 11, wherein widths of the first and second layers are different from each other in a horizontal direction.

13. The light emitting device of claim 12, wherein the widths of the first and second layers are greater than the thicknesses of the first and second layers.

14. The light emitting device of claim 7, wherein, when a portion of the upper layer is the first layer, the portion of the upper layer forms an ohmic contact with one of the first and second conductive semiconductor layers.

15. The light emitting device of claim 7, wherein, when a portion of the upper layer is the second layer, the portion of the upper layer forms a Schottky contact with one of the first and second conductive semiconductor layers.

16. The light emitting device of claim 1, wherein a light incident into the light extraction structure from the light emitting structure is reflected toward an outside with respect to a vertical interface of the light extraction structure.

17. The light emitting device of claim 1, wherein the light emitting structure generates an ultraviolet light having a wavelength in a range of 365 nm to 488 nm.

18. A light emitting device comprising:
a substrate;
a first conductive semiconductor layer on the substrate;
an active layer on the first conductive semiconductor layer;
a second conductive semiconductor layer on the active layer; and
a light extraction structure on the second conductive semiconductor layer,
wherein the first conductive semiconductor layer is an n-type semiconductor layer and the second conductive semiconductor layer is a p-type semiconductor layer,
wherein the light extraction structure comprises a plurality of first layers and a plurality of second layers which are alternately disposed with each other to have a negative refraction index, and
wherein the first layer is a dielectric layer and the second layer is a metal layer, and at least one of the first and second layers has a thickness of $0.2\lambda_p$ wherein $\lambda_p$ denotes a plasma frequency of the second layer.

19. A light emitting device comprising:
a first conductive semiconductor layer;
an active layer under the first conductive semiconductor layer;
a second conductive semiconductor layer below the active layer;
an electrode layer under the second conductive semiconductor layer; and
a light extraction structure on the first conductive semiconductor layer,
wherein the first conductive semiconductor layer is an n-type semiconductor layer and the second conductive semiconductor layer is a p-type semiconductor layer,
wherein the light extraction structure comprises a plurality of first layers and a plurality of second layers which are alternately disposed with each other to have a negative refraction index, and
wherein the first layer is a dielectric layer and the second layer is a metal layer, and at least one of the first and second layers has a thickness of $0.2\lambda_p$, wherein $\lambda_p$ denotes a plasma frequency of the second layer.

* * * * *